(12) United States Patent
Venugopalappa et al.

(10) Patent No.: US 12,314,078 B2
(45) Date of Patent: May 27, 2025

(54) INFRASTRUCTURE ARTICLE SYSTEM FOR SYNCHRONIZING BLINKS OF INFRASTRUCTURE ARTICLES CONNECTED IN MESH NETWORK

(71) Applicant: 3M INNOVATIVE PROPERTIES COMPANY, St. Paul, MN (US)

(72) Inventors: Lingesh Venugopalappa, Bangalore (IN); Justin M. Johnson, Hudson, WI (US); Eric J. Larson, Bayport, MN (US); James W. Howard, North Oaks, MN (US); Mark G. Mathews, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 120 days.

(21) Appl. No.: 18/031,051

(22) PCT Filed: Oct. 22, 2021

(86) PCT No.: PCT/IB2021/059759
§ 371 (c)(1),
(2) Date: Apr. 10, 2023

(87) PCT Pub. No.: WO2022/084935
PCT Pub. Date: Apr. 28, 2022

(65) Prior Publication Data
US 2023/0376069 A1    Nov. 23, 2023

(30) Foreign Application Priority Data
Oct. 22, 2020 (IN) .............................. 202041046086

(51) Int. Cl.
*G06F 1/14* (2006.01)
*G01R 31/382* (2019.01)
(Continued)

(52) U.S. Cl.
CPC ............. *G06F 1/14* (2013.01); *G01R 31/382* (2019.01); *G06F 1/3212* (2013.01); *H04W 4/80* (2018.02);
(Continued)

(58) Field of Classification Search
CPC ... G06F 1/10; G06F 1/105; G06F 1/12; G06F 1/14; G06F 15/17325; G06F 1/321;
(Continued)

(56) References Cited

U.S. PATENT DOCUMENTS 9,784,417 B1 * 10/2017 Springer ............... F21V 19/003
2006/0258322 A1 * 11/2006 Conner ............ H04W 52/0296
455/343.1
(Continued)

FOREIGN PATENT DOCUMENTS

CN         102305353 B    3/2013
CN         209178859 U    7/2019
(Continued)

OTHER PUBLICATIONS

Ebi, "Synchronous LoRa Mesh Network to Monitor Processes in Underground Infrastructure", IEEE Access, May 2019, vol. 7, pp. 57663-57677.
(Continued)

*Primary Examiner* — Thomas J. Cleary

(57) ABSTRACT

Embodiment herein provides an Infrastructure article (101) and method thereof for synchronizing blinks of infrastructure articles in a mesh network. The method includes detecting an expiry of a sync timer counted by a real time clock (RTC) and determining whether a charge level of a battery (105) of the infrastructure article (101) meets a battery charge threshold. When the charge level of the battery (105) of the infrastructure article (101) meets the battery charge threshold, the method includes establishing a connection
(Continued)

with other infrastructure article and/or an infrastructure article server (200) in the mesh network, and sending a time to synchronize blink of the at least one light source (106) to all other infrastructure articles in the mesh network. When the charge level of the battery (105) of the infrastructure article (101) does not meet the battery charge threshold, the method includes resetting the sync timer, and initiating a count of the sync timer.

9 Claims, 6 Drawing Sheets

(51) Int. Cl.
*G06F 1/3212* (2019.01)
*H04W 4/80* (2018.01)
*H04W 56/00* (2009.01)
*G06F 1/10* (2006.01)
*H04W 84/18* (2009.01)

(52) U.S. Cl.
CPC ......... *H04W 56/0015* (2013.01); *G06F 1/105* (2013.01); *H04W 84/18* (2013.01); *Y02D 30/70* (2020.08)

(58) Field of Classification Search
CPC .... G06F 1/3212; G01R 31/382; H04W 84/18; H04W 84/20; H04W 56/001; H04W 56/0015; H04W 56/002; H04W 56/0025; H04W 4/80; Y02D 30/70
See application file for complete search history.

(56) References Cited

U.S. PATENT DOCUMENTS

| | | |
|---|---|---|
| 2010/0134257 A1 | 6/2010 | Puleston et al. |
| 2010/0141153 A1* | 6/2010 | Recker ................ H05B 45/357 |
| | | 315/149 |
| 2013/0271014 A1 | 10/2013 | Dasaratha et al. |
| 2014/0118143 A1 | 5/2014 | Monacos et al. |
| 2015/0271772 A1* | 9/2015 | Knowles ........... H04W 56/0015 |
| | | 370/350 |
| 2017/0105096 A1 | 4/2017 | Olson |
| 2017/0359412 A1* | 12/2017 | Haebler ................. H04W 4/029 |
| 2018/0058021 A1 | 3/2018 | Lee et al. |
| 2019/0073179 A1* | 3/2019 | Laidlaw ................... G09G 3/14 |
| 2019/0208381 A1* | 7/2019 | Booij ...................... G01S 1/725 |
| 2020/0077892 A1 | 3/2020 | Tran |
| 2020/0154344 A1 | 5/2020 | Crouthamel et al. |

FOREIGN PATENT DOCUMENTS

| | | |
|---|---|---|
| JP | 2005273266 A | 10/2005 |
| WO | 2001031125 A1 | 5/2001 |
| WO | 2012074681 A1 | 6/2012 |

OTHER PUBLICATIONS

International Search Report for PCT International Application No. PCT/IB2021/059759, mailed on Jan. 28, 2022, 2 pages.

* cited by examiner

INFRASTRUCTURE ARTICLE SYSTEM FOR SYNCHRONIZING BLINKS OF INFRASTRUCTURE ARTICLES CONNECTED IN MESH NETWORK

CROSS REFERENCE TO RELATED APPLICATIONS

This application is a national stage filing under 35 U.S.C. 371 of PCT/IB2021/059759, filed Oct. 22, 2021, which claims the benefit of Indian Application No. 202041046086, filed Oct. 22, 2020, the disclosures of which are incorporated by reference in their entireties herein.

The present disclosure relates to an infrastructure article system, more particularly relates to an infrastructure article system and method thereof for synchronizing blinks of infrastructure articles connected in a mesh network. The proposed synchronizing system and method are useful in efficiently connecting the infrastructure articles and consumes less power in achieving the data transfer and synchronization of the infrastructure articles.

BACKGROUND

Smart infrastructure articles are the devices used besides the road or pathways as road safety furnitures. These are active and connected devices that communicate using wireless methodologies to provide warning of hazardous locations for the road users. The infrastructure articles can be a sustainable product where the solar energy is harvested to the battery in sunlight and will be dissipated to Light emitting diode (LEDs) in night. The existing infrastructure article installed in the group will distract the drivers in the night times as the time of blinks of the infrastructure articles is not linear and they do not blink in a synced manner. This problem may lead to accidents as the driver find it difficult/confusing on the road.

Another major challenge in the infrastructure article having a solar panel used for charging, is that the size of the solar panel is limited and hence we have limited energy. Some of the conventional wireless section comes with additional power that varies from 7 mA-10 mA. The infrastructure article a dependent on sun cannot perform well due to this high current consumption.

Further, another cause for road accidents especially on roads with curves like mountainous areas is increasing speed as the drivers are unaware of speed limits. The roads at mountainous areas and highways are filled with lot of curves. These curves are extremely dangerous as there will be no visibility of incoming vehicles. At the same time having active speed limits increase the chances of getting the attention of drivers. Hence it is desirable to address the challenge of invisibility of the incoming vehicles from the other side.

Therefore, there remains a need to address the above problem or at least provide an alternate solution.

One objective of the embodiments herein is to provide a method and an Infrastructure article system for synchronizing blinks of an infrastructure article in a mesh network. The proposed method would reduce the design cost of synchronizing blinks between a set of infrastructure articles and utilizes limited energy of the infrastructure article to get maximum backup time for blinking.

Another object of the embodiments is to increase or decrease the sync time of a sync timer when a difference between current time data and previous time data meets a difference threshold.

Yet another object of the embodiments is to configure the infrastructure article in normal mode and sleep mode in which the normal mode switches on wireless communication along with all peripherals of the infrastructure article and the sleep mode switches off all peripherals of the infrastructure article and wake up by an interrupt to configure into the normal mode.

Yet another object of the embodiments is to detect a failure with the infrastructure article when a signal is not received from the infrastructure article.

Yet another object of the embodiments is to provide a warning system using the infrastructure articles that helps to alert drivers on curves of a road along with speed limit required for those curves.

SUMMARY

In one aspect of the disclosure the object is satisfied by providing a method for synchronizing blinks of an Infrastructure article in a mesh network. The method includes detecting an expiry of a sync timer counted by a real time clock (RTC) of the infrastructure article, and determining whether a charge level of a battery of the infrastructure article meets a battery charge threshold. In response to determining that the charge level of the battery of the infrastructure article meets the battery charge threshold, the method includes establishing a connection with at least one of other infrastructure article and a infrastructure article server in the mesh network, and sending a time to synchronize blink of the at least one light source to all other infrastructure articles in the mesh network. In response to determining that the charge level of the battery of the infrastructure article does not meet the battery charge threshold, the method includes resetting the sync timer, and initiating a count of the sync timer by the RTC.

In an embodiment, the time to synchronize blink of the at least one light source of the infrastructure article is sent using at least one of a Global Position System (GPS), an atomic clock, and also through the time information emitted from the vehicle system. This is another proposed method of synchronization where wireless chip is updated with the time data from a satellite.

Further, the method comprises determining a difference between current time data and previous time data, and determining whether the difference meets a difference threshold. In response to determining that the difference meets the difference threshold, the method includes increasing a sync time of the sync timer, and resetting the sync timer to the increased sync time. In response to determining that the difference does not meets the difference threshold, the method includes decreasing a sync time of the sync timer and resetting the sync timer to the decreased sync time.

In an embodiment, the time to synchronize blink of the at least one light source is sent by the infrastructure article without communicating with the other infrastructure article or the infrastructure article server.

Further, the method includes automatically configuring the other infrastructure article into a mesh network mode before establishing the connection with at least one of the other infrastructure article and the infrastructure article server in the mesh network. Furthermore, the method includes automatically configuring the infrastructure article into a low power mode after sending the time to synchronize blink of the at least one light source to all other infrastructure articles in the mesh network.

In an embodiment, the method comprises detecting a night time counted by the RTC, and automatically configuring the infrastructure article into a normal mode. The normal mode switches on wireless communication along with all peripherals of the infrastructure article.

In an embodiment, the method includes detecting a day time counted by the RTC and automatically configuring the infrastructure article into a sleep mode. The sleep mode switches off all peripherals of the infrastructure article and wake up by an interrupt to configure into the normal mode.

In an embodiment, the method includes determining whether a signal is received from the at least one other infrastructure articles in the mesh network, and detecting a failure of the at least one other infrastructure article in response to determining that the signal is not received from the at least one other infrastructure article.

In another aspect the object is satisfied by providing an infrastructure article for synchronizing blinks in a mesh network. The infrastructure article includes a RTC to count a sync timer, a wireless transceiver, a solar cell, a battery connected to the solar cell and the wireless transceiver, a light source connected to the battery, and a synchronization controller connected to the light source. The synchronization controller configured to detect an expiry of the sync timer counted by the RTC, and determine whether a charge level of the battery of the infrastructure article meets a battery charge threshold. In response to determining that the charge level of the battery of the infrastructure article meets the battery charge threshold, the synchronization controller is configured to establish a connection with at least one of other infrastructure article and a infrastructure article server in the mesh network, and send a time to synchronize blink of the at least one light source to all other infrastructure articles in the mesh network. In response to determining that the charge level of the battery of the infrastructure article does not meets the battery charge threshold, the synchronization controller is configured to reset the sync timer and initiate a count of the sync timer by the RTC.

Further, the synchronization controller is configured to determine a difference between current time data and previous time data, and determine whether the difference meets a difference threshold. In response to determining that the difference meets the difference threshold, synchronization controller is configured to increase a sync time of the sync timer, and reset the sync timer to the increased sync time. In response to determining that the difference does not meets the difference threshold, synchronization controller is configured to decrease a sync time of the sync timer, and reset the sync timer to the decreased sync time.

In an embodiment, the synchronization controller is configured to automatically configure the infrastructure article into a mesh network mode before establishing the connection with at least one of the other infrastructure article and the infrastructure article server in the mesh network.

In an embodiment, the synchronization controller is configured to automatically configure the infrastructure article into a low power mode after sending the time to synchronize blink of the at least one light source to all other infrastructure articles in the mesh network.

In an embodiment, the synchronization controller is configured to detect a night time counted by the RTC, and automatically configure the infrastructure article into a normal mode, wherein the normal mode switches on wireless communication along with all peripherals of the infrastructure article.

In an embodiment, the synchronization controller is further configured to detect a day time counted by the RTC, and automatically configure the infrastructure article into a sleep mode, wherein the sleep mode switches off all peripherals of the infrastructure article and wake up by an interrupt to configure into the normal mode.

In an embodiment, the synchronization controller is configured to determine whether a signal is received from the at least one other infrastructure article in the mesh network, and detect a failure of the at least one other infrastructure article in response to determining that the signal is not received from the at least one other infrastructure article in the mesh network.

In yet another aspect the object is satisfied by providing an infrastructure article system for synchronizing blinks in a mesh network. The infrastructure article system includes an infrastructure article server, and a plurality of infrastructure articles in which at least one infrastructure article from the plurality of infrastructure articles acts as master infrastructure article and remaining infrastructure article from the plurality of infrastructure articles acts as slave infrastructure article. The master infrastructure article is configured to detect night time, connect with at least one of slave infrastructure articles and the infrastructure article server in the mesh network and enters into the mesh network mode, and send a time sync information to the at least one slave infrastructure article in the mesh network and enter into a low power mode from the mesh network mode. The master infrastructure article and the at least one slave infrastructure article start a count of a sync timer at same time in the mesh network for synchronizing blinks in the mesh network.

In an embodiment, connect with at least one of the slave infrastructure articles and the infrastructure article server in the mesh network and enters into the mesh network mode comprises detect an expiry of the sync timer counted and determine whether a charge level of the battery of the at least one master infrastructure article meets a battery charge threshold. In response to determining that the charge level of the batter of the at least one master infrastructure article meets the battery charge threshold, establish the connection with at least one of the slave infrastructure article and the infrastructure article server in the mesh network. Further, in response to determining that the charge level of the battery of the master infrastructure article does not meets the battery charge threshold, reset the sync timer and initiate a count of the sync timer.

In an embodiment, the time sync information to synchronize blink of the at least one slave infrastructure article is sent by the at least one master slave infrastructure article using at least one of a Global Position System (GPS), an atomic clock, and a vehicle system.

In an embodiment, the master infrastructure article is further configured to determine a difference between current time data and previous time data and determine whether the difference meets a difference threshold. In response to determining that the difference meets the difference threshold, increase a sync time of the sync timer, and reset the sync timer to the increased sync time. Further, in response to determining that the difference does not meets the difference threshold, decrease a sync time of the sync timer, and reset the sync timer to the decreased sync time.

In an embodiment, the time sync information to synchronize blink of the at least one slave RPM is sent by the at least one master infrastructure article without communicating with the other infrastructure article or the infrastructure article server in the mesh network.

In an embodiment, the normal mode switches on wireless communication along with all peripherals of the at least one master infrastructure article.

In an embodiment, the sleep mode switches off all peripherals of the at least one master infrastructure article and wake up by an interrupt to configure into the normal mode.

In an embodiment, the master infrastructure article is further configured to determine whether a signal is received from at least one slave infrastructure article in the mesh network, and detect a failure of the at least one other infrastructure article in response to determining that the signal is not received from the at least one other infrastructure article in the mesh network.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF DRAWINGS

The proposed Infrastructure articles and method thereof is illustrated in the accompanying drawings, throughout which like reference letters indicate corresponding parts in the various figures. The embodiments herein will be better understood from the following description with reference to the drawings, in which.

DETAILED DESCRIPTION

Figure 1:
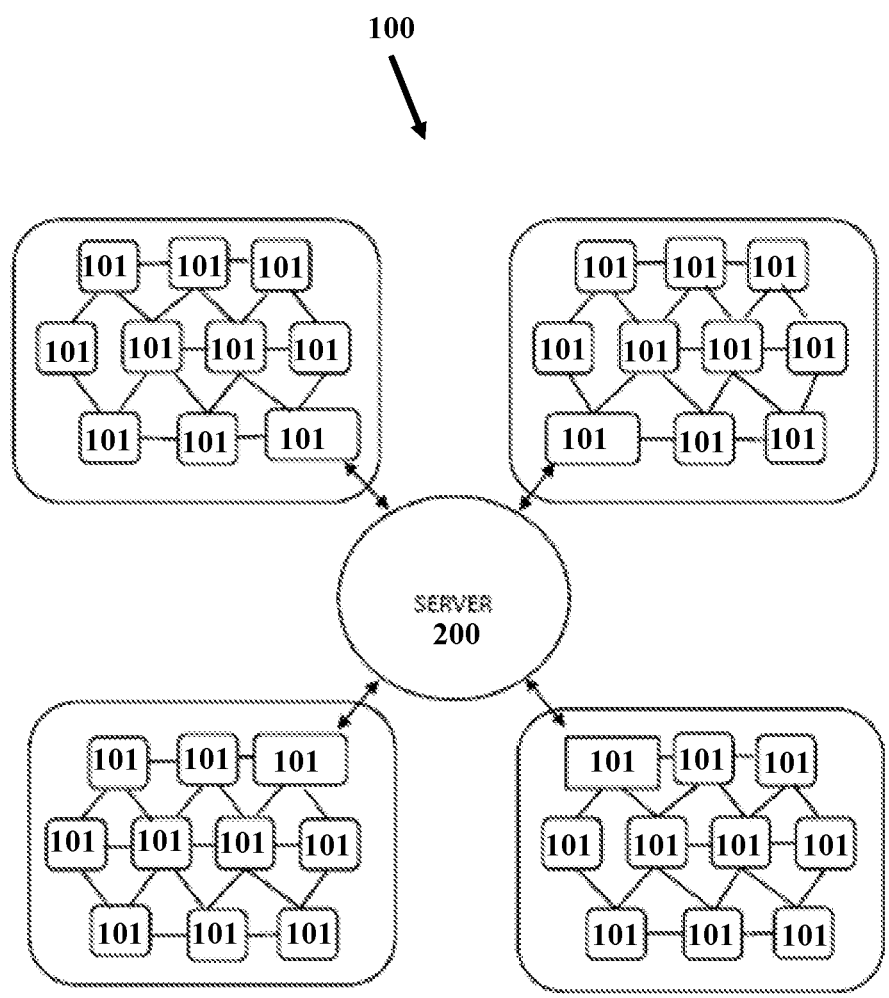
FIG. 1 illustrates a infrastructure article system including multiple RPMs connected with each other in a mesh network, according to embodiments as disclosed herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Referring now to the drawings, and more particularly to FIGS. 1-6, there are shown preferred embodiments.

FIG. 1 illustrates an infrastructure article system (100) including multiple infrastructure articles (101) connected to each other in a mesh network, according to embodiments as disclosed herein. A physical environment wherein such infrastructure articles may be used is a transportation system that includes transportation pathways, vehicles or objects moving through the transportation pathways and various infrastructure elements (generally referred to as "infrastructure"). The transportation pathways include, vehicle pathways, bicycle pathways, pedestrian pathways, among others. In other examples, the transportation pathways may be sidewalks, public spaces, or other surfaces not specifically dedicated to certain types of vehicles or traffic. The vehicle pathways may be used by vehicles to transport people or goods. Examples of vehicles may be cars, trucks, buses and among others. The bicycle pathways may be used by bicycles, electrically powered or battery powered vehicles. The pedestrian pathways may be used by pedestrians, such as sidewalk or jogging path. The transportation pathways may also include, for example, road shoulder, physical structures near pathway such as toll booths, railroad crossing equipment, traffic lights, guardrails, and generally encompassing any other properties or characteristics of the pathway or objects/structures in the vicinity or proximity of the pathways.

Examples of infrastructure articles include a pavement marking example, roadway sign, a license plate, a conspicuity tape, a hazard marker (example, a traffic cone, a traffic barricade, a safety barrier, and among others), a road pavement marker, a flexible median marker. The infrastructure articles may also include a delineator, any road markers placed on erect structures (e.g. posts or trees or building walls) in transport pathways or placed on transportation pathways. The infrastructure article may have an inbuilt battery that is rechargeable, which facilitates its functioning. The inbuilt battery may be rechargeable by solar energy and thus the infrastructure article may have a solar panel. The inbuilt battery of the infrastructure article may be recharged using various other technologies and methodologies available.

Now referring back to FIG. 1, the infrastructure articles (101) are connected to each other using a mesh topology. The infrastructure article (101) may have an inbuilt battery that is rechargeable, which facilitates its functioning. The inbuilt battery may be rechargeable by solar energy and thus the infrastructure (101) article may have a solar panel. The inbuilt battery of the infrastructure article (101) may be recharged using various other technologies and methodologies available. The mesh topology is applied to achieve communication between the infrastructure articles (101) to communicate among each other and an infrastructure article server (200). Among the multiple infrastructure articles (101) connected in the mesh network, one infrastructure article (101) can act as a master infrastructure article (101) and other acts as slave infrastructure article (101). The master infrastructure article (101) is responsible to create connection with infrastructure article server (200) and other infrastructure articles (101) in the mesh network and send the time sync information. As shown in the FIG. 1 all infrastructure articles are given same figure numeral (101) for the sake of convenience of representation and description.

The proposed solution works in different modes such as sleep mode, normal mode, low power mode, and mesh network mode. If the mesh network mode is used continuously then there will be a major effect on energy saving as it consumes 10-11 mA all the time due to which at least 132 mAH is required just for the Wireless transceiver alone. The wireless transceiver may function based on for example, a Bluetooth technique, Wi-Fi, Zigbee wireless technique or any other wireless communication technologies. And hence the sunlight requirement on the device is high. It has to generate at least 300 mAH of power every day which can keep infrastructure article to blink for the whole night. Hence in order to save the power, wireless based mesh solution can be used in which a wireless chip comes with the low power modes.

In an embodiment, the normal mode switches on wireless communication along with all peripherals of the infrastructure article (101).

In an embodiment, the sleep mode switches off all peripherals of the infrastructure article (101) and wake up by an interrupt to configure into the normal mode.

In an embodiment, in the low power mode the current consumption is about 1-2 uA.

In an embodiment, in the mesh network mode the current consumption is about 11 mA.

Based on the above modes, the patterns described hereinbelow can be used to save the battery and avoid wastage of power.

In an embodiment, in order to avoid battery discharge completely after manufacturing the infrastructure article (101) and kept in ware house, the infrastructure article (101) shall be kept in the sleep mode and wakeup only when an external voltage interrupt is connected to a solar panel of the infrastructure article (101). In actual scenario for the first time, the infrastructure article (101) is in the sleep mode and it activates only when the infrastructure article (101) detects the sunlight. In this case the power consumption will be less than 1 uA that helps to extend the shelf life of battery of the infrastructure article (101).

In an embodiment, in order to increase the shelf life of the battery an internal Real time clock (RTC) (that comes with every infrastructure article (101) as shown in the FIG. 2) can be used as follows:
  i. As soon as the night is detected the infrastructure article (101) goes to the normal mode.
  ii. Then enters into the mesh network mode after connecting to multiple other infrastructure articles (101) in the mesh network.
  iii. Once connected with all the infrastructure article (101), the master infrastructure article (101) (i.e. an infrastructure article (101) operates as a master infrastructure article) send time sync information to all the other infrastructure article (101) in the mesh network.
  iv. Then immediately the system is brought down from the mesh network mode to the low power mode.
  v. The RTC clock starts counting the time sync in the master infrastructure article (101) and hence it will start counting at the same time in all the other infrastructure article (101) in the mesh network.
  vi. Every hour again the master infrastructure article (101) enters the mesh network mode and stay for a certain predefined time period (for example, 10 minutes) and then goes back to the low power mode. The predefined time may be set by the user or in another embodiment, predefined time may be preset when the infrastructure article is manufactured.
  vii. The cycle repeats after certain time interval, for example 1 hour. This time interval may be set or programmed by the user. In another embodiment, the time interval may be set when the infrastructure article system (101) is set up.

Using this solution most of the time the infrastructure articles connected in the mesh network will be in low power mode and hence it will consume about 80% less power compared to the mesh network mode.

In an embodiment, in order to increase the shelf life of the battery an external Real time clock (RTC) (that comes with every infrastructure article (101) as shown in the FIG. 2) can be used as follows:
  viii. As soon as the night is detected the infrastructure article (101) goes to the normal mode.
  ix. Then enters into the mesh network mode after connecting to multiple other infrastructure articles (101) in the mesh network.
  x. Once connected with all the infrastructure article (101), the master infrastructure article (101) sends time sync information to all the other infrastructure articles (101) in the mesh network.
  xi. Then immediately the system is brought down from the mesh network mode to the low power mode.
  xii. It continues until certain time period (for instance, next day morning) and stops as soon as the master infrastructure article (101) detects the sunlight and goes to sleep mode.
  xiii. The same day evening when the sunsets the darkness will be detected and the master infrastructure article (101) enters in the mesh network mode.
  xiv. The cycle from 1-7 repeats every night.

Figure 2:
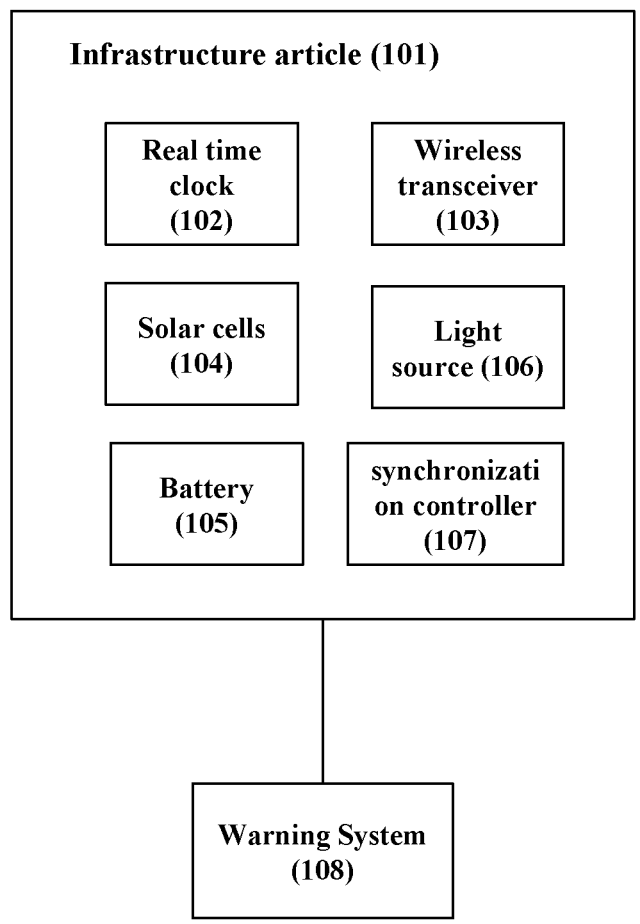
FIG. 2 illustrates an Individual synchronized infrastructure article, according to embodiments as disclosed herein.

FIG. 2 illustrates an infrastructure article (101), according to various embodiments as disclosed herein. The infrastructure article (101) includes a RTC (102) to count a sync timer, a wireless transceiver (103), solar cells (104), a battery (105) connected to the solar cells (104) and the wireless transceiver (103), one or more light source (106) connected to the battery (105), and a synchronization controller (107) connected to the light source (106). Each of the infrastructure articles (101) in the infrastructure article system (100) as shown in the FIG. 1 may have similar components as described and shown in the FIG. 2. In another embodiment, the infrastructure article (101) may have a battery (e.g. the battery 105) may be recharged using any other technologies or methodologies and in such embodiment, the infrastructure article (101) may not have solar cells (e.g. the solar cells).

Generally, in any infrastructure article (101) there are two clocks. In an embodiment, one clock is from the controller which has high tolerance and another is the RTC (102) which has bare minimum tolerance (For example, for one year it can drift maximum of 32 seconds). The RTC (102) described herein has capability of counting seconds accurately with very minimum delay. Every night when the infrastructure articles (101) are in dark, the RTC (102) forms the mesh network as described above and update the RTC (102) with common clock and disconnects the wireless transceiver (103). The RTC (102) keeps the count of the clock and starts blinking the light source (106) as per the clock timing. So, there will be absolutely no delay within every infrastructure article (101) and hence all RPMs blink at the same time.

The wireless transmitter (103) comprises both transmitter and a receiver. The wireless transmitter (103) converts the time sync information into either Radio Frequency (RF) or light and transmits it to the other infrastructure articles (101) in the mesh network.

The one or more light sources (106) can be light emitting diode. A single or motile LEDs can be deployed inside each of the infrastructure articles (101) to provide visual indications on the road. The LEDs can blink the infrastructure articles (101) at different colors based on data sent. For example, the infrastructure articles (101) may blink (i.e. flashing LED lights) in 'red color' to indicate to a road user that there is traffic ahead or road accident or road closure. In another scenario, the infrastructure articles (101) may blink in 'yellow color' communicating to the road user that it is bad weather ahead or an alert to the road user for slowing down the vehicle. The infrastructure articles (101) may blink in 'green color' to indicate to road user that there no traffic or obstruction ahead and vehicle can move freely. Further, in still other embodiments, the infrastructure articles (1010) can illuminate in variety of different colors, flashing pattern and so on.

The synchronization controller (107) is configured to detect an expiry of the sync timer counted by the RTC and determine whether a charge level of the battery (105) of the infrastructure article (101) meets a battery charge threshold. In an embodiment, the battery charge threshold defines a minimum charge required for battery to run the circuit. In response to determining that the charge level of the battery of the infrastructure article (101) meets the battery charge threshold, the synchronization controller (107) establishes a connection with at least one of other infrastructure article and the infrastructure article server (200) in the mesh network, and sends a time to synchronize blink of the at least one light source (106) to all other infrastructure articles in the mesh network. In an embodiment, the time to synchronize blink of the at least one light source (106) of the infrastructure article (101) is sent using at least one of a Global Position System (GPS), an atomic clock, and a vehicle system. In an embodiment, the time to synchronize blink of the at least one light source (106) of the infrastructure article (101) is sent by the infrastructure article (101) without communicating with the other infrastructure article (101) or the infrastructure article server (200).

In response to determining that the charge level of the battery (105) of the infrastructure article (101) does not meet the battery charge threshold, the synchronization controller (107) resets the sync timer and initiate a count of the sync timer by the RTC (102). For example, if the charge level of the battery (105) of the infrastructure article (101) is lower than the desired battery charge threshold then the sync timer is reset and a count of the sync timer is initiated by the RTC (102).

Further, the synchronization controller (107) is further configured to determine a difference between current time data and previous time data and determine whether the difference meets a difference threshold. In response to determining that the difference meets the difference threshold, the synchronization controller (107) increases a sync time of the sync timer, and resets the sync timer to the increased sync time. In response to determining that the difference does not meets the difference threshold, the synchronization controller (107) decreases a sync time of the sync timer, and resets the sync timer to the decreased sync time. For example, as not all the timer are accurate due to tolerance issues in the chip, if the difference in the timing is more than the difference threshold of 2 milli-seconds (where eye can catch the difference) then these infrastructure articles will get a timing data auto corrected in order to ensure that there is no difference in the blinking timing.

In an embodiment, the synchronization controller (107) is further configured to automatically configure the infrastructure article (101) into a mesh network mode before establishing the connection with at least one of the other infrastructure article and the infrastructure article server (200) in the mesh network.

In an embodiment, the synchronization controller (107) is further configured to automatically configure the infrastructure article (101) into a low power mode after sending the time to synchronize blink of the at least one light source (107) to all other infrastructure articles in the mesh network.

In an embodiment, the synchronization controller (107) is further configured to detect a night time counted by the RTC (102) and automatically configure the infrastructure article (101) into a normal mode, wherein the normal mode switches on wireless communication along with all peripherals of the infrastructure article (101). Further, when day time is counted by the RTC (102), the synchronization controller (107) automatically configures the infrastructure article (101) into a sleep mode, wherein the sleep mode switches off all peripherals of the infrastructure article (101) and wake up by a voltage interrupt to configure into the normal mode.

Further, in an embodiment, the synchronization controller (107) is further configured to determine whether a signal is received from the at least one other infrastructure article in the mesh network and detect a failure of the at least one other infrastructure article in response to determining that the signal is not received from the at least one other infrastructure article in the mesh network.

Unlike the conventional infrastructure article, the proposed solution is used to switch on/off the infrastructure articles based on remote time settings, sync the infrastructure articles that are separated by 25 meters and blink at certain frequency with almost zero communication delay through wireless communication, blink infrastructure articles at different colors based on data sent, and monitor a number of nodes connected in the mesh network and notifying if any node connection fails.

Furthermore, the infrastructure article (101) is connected to a warning system (108). The warning system (108) uses the infrastructure articles (101) that helps to alert the drivers on the curves along with a speed limits required for those curves by the synchronization controller (107) available inside the Infrastructure articles (101). The synchronization controller (107) communicates to signage place just before the cars to provide the practice alerts to the driver. This helps in addressing the challenge of invisibility of the incoming vehicles from the other side. Further, the warning systems (108) can also display information other than speed warning such as, but is not limited to, accident, road block ahead for incoming vehicle, weather alert, and traffic congestion, traffic density, and warning signs. These warning signs described herein are speed active and instantaneous speed warning displays placed at sides of the road especially at the curves or junctions.

Figure 3:
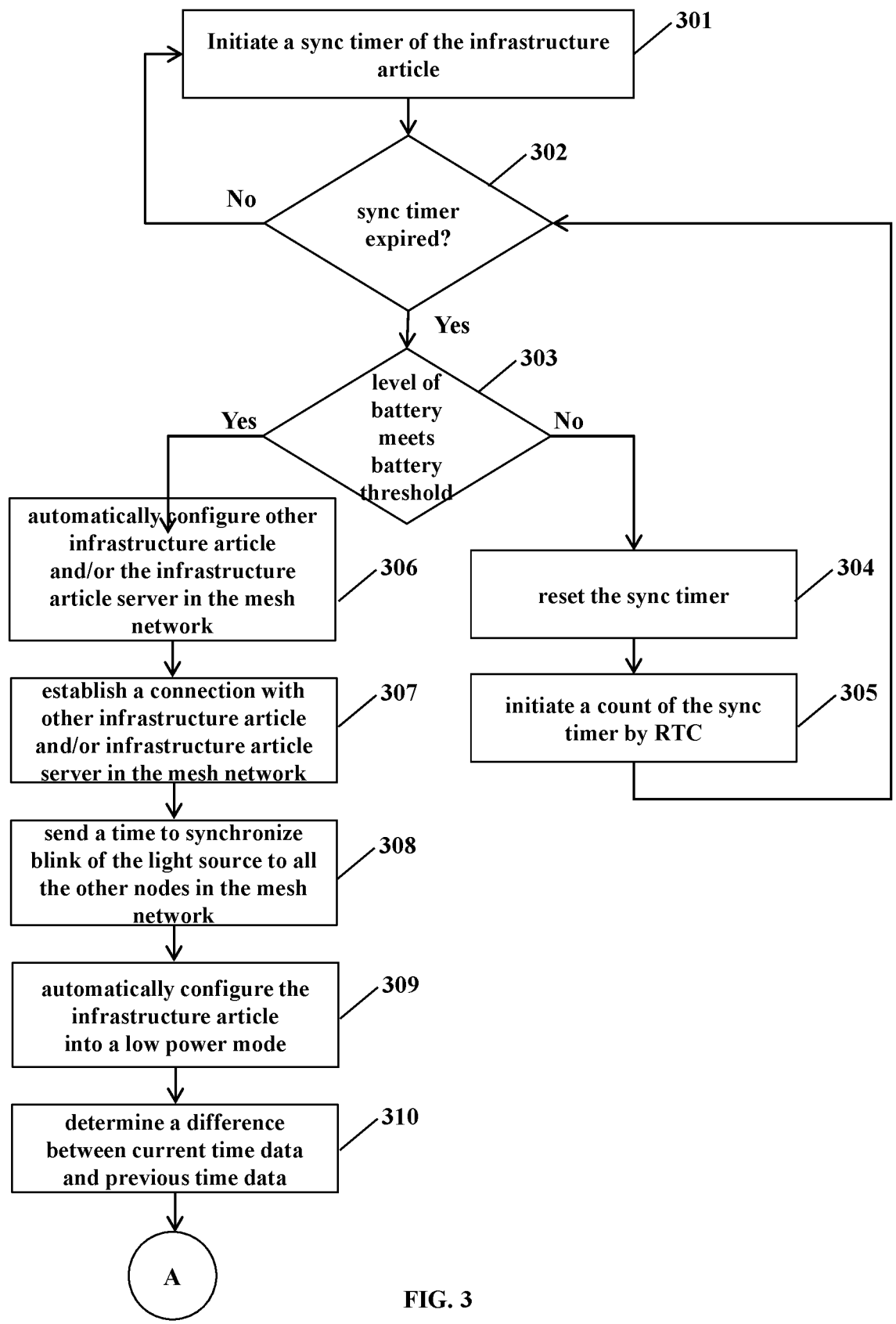
FIG. 3 is a flow chart illustrating a method for synchronizing blinks the infrastructure articles in the mesh network, according to embodiments as disclosed herein.
Figure 3:
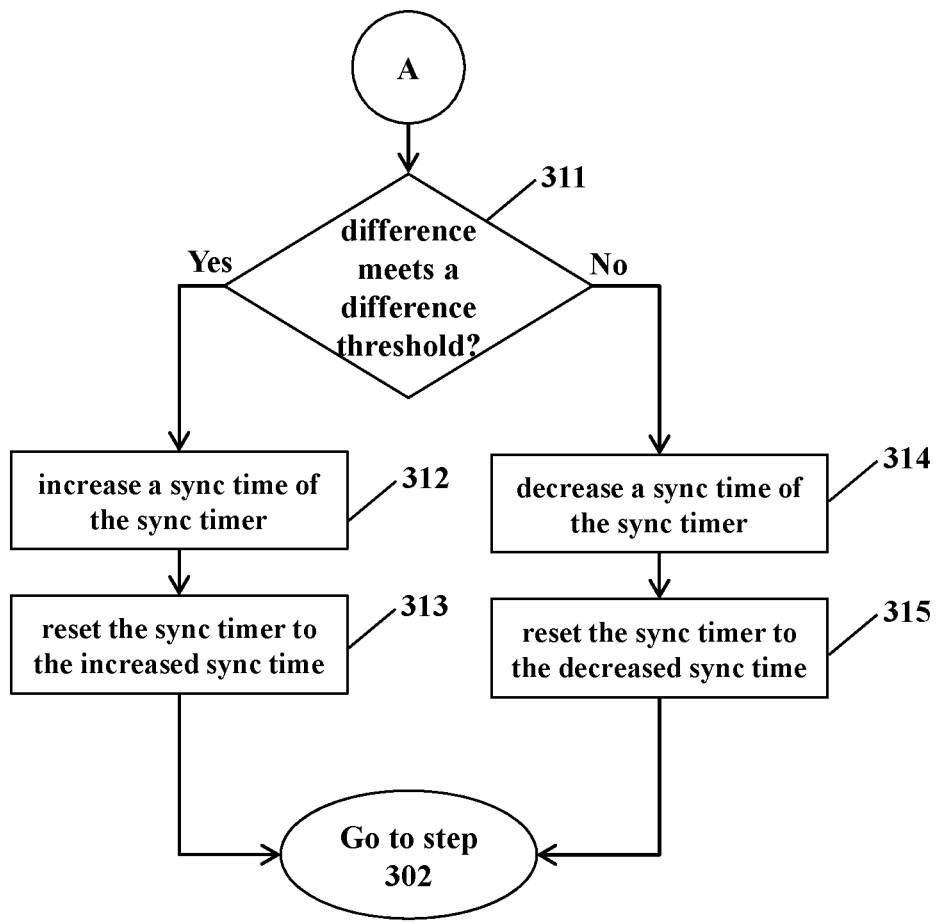

FIG. 3 is a flow chart illustrating a method for synchronizing blinks the Infrastructure articles (101) in the mesh network, according to embodiments as disclosed herein.

At step 301, the method includes initiating sync timer of the infrastructure article (101). The sync timer is initiated upon receiving an indication from the RTC (102).

At step 302, the method includes detecting an expiry of the sync timer counted by the RTC (102) of the infrastructure article (101).

In response to detecting the expiry of the sync timer, at step 303, the method includes determining whether a charge level of a battery (105) of the infrastructure article (101) meets a battery charge threshold.

In response to determining that the charge level of the battery (105) of the infrastructure article (101) does not meet the battery charge threshold, at steps 304-305, the method includes resetting the sync timer, and initiating a count of the sync timer by the RTC (102).

Further, in response to determining that the charge level of the battery (105) of the infrastructure article (101) meets the battery charge threshold, at step 306, the method includes automatically configuring other infrastructure article (101) and/or the infrastructure article server (200) in the mesh network.

Upon successful configuration, at step 307, the method includes establishing a connection with the other infrastructure articles (101) in the mesh network and/or the infrastructure article server (200) in the mesh network. Upon creating the connection, the method includes sending a time to synchronize blink of the at least one light source (106) to all other nodes in the mesh network as shown at step 308.

At step 309, the method includes automatically configuring the infrastructure article into a low power mode after sending the time to synchronize blink of the light source (106) to all other nodes in the mesh network.

At step 310, the method includes determining a difference between current time data and previous time data. At step 311, the method includes determining whether the difference between the current time data and the previous time data meets a difference threshold. In response to determining that the difference meets the difference threshold, at steps 312-313, the method includes increasing a sync time of the sync timer, and resetting the sync timer to the increased sync time. In response to determining that the difference does not meets the difference threshold, at steps 314-315, the method includes decreasing a sync time of the sync timer, and resetting the sync timer to the decreased sync time. In an embodiment, the current time data is compared with the previous time data to determine an error in time. The error may be a time difference and the difference threshold may be an error threshold. Further, the method loops back to step 302.

Figure 4:
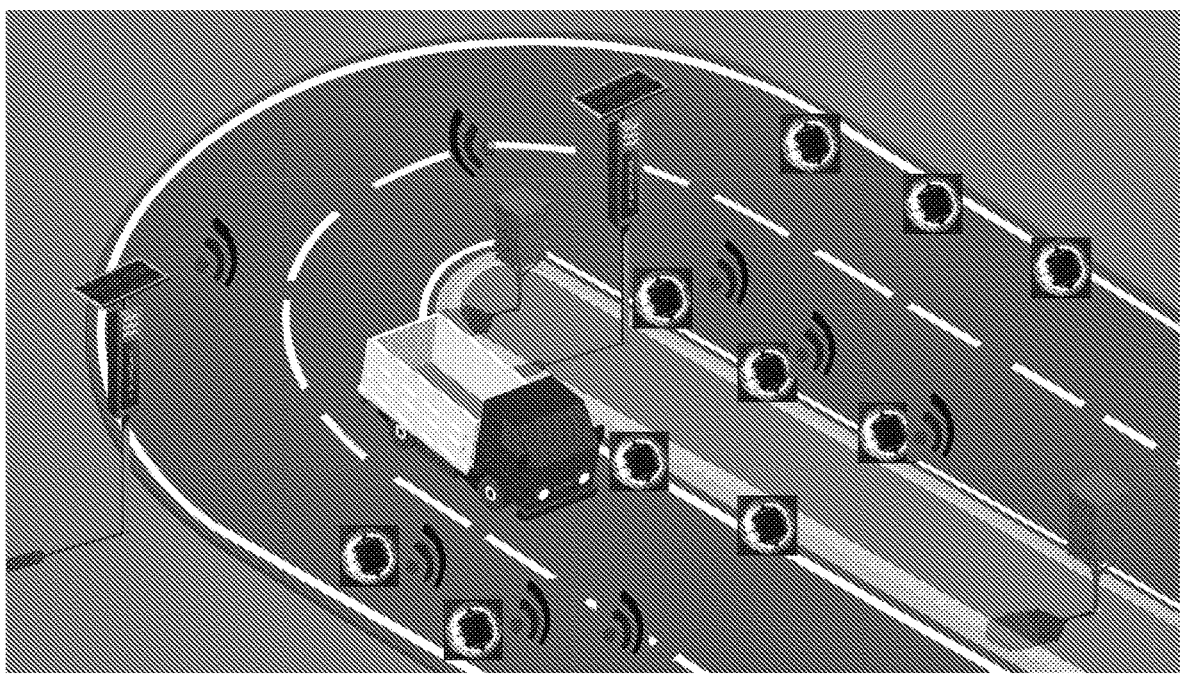
FIG. 4 illustrates an example scenario of a warning system according to embodiments as disclosed herein.

FIG. 4 illustrates an example scenario of the warning system (108) as shown in the FIG. 2 according to embodiments as disclosed herein. The warning system (108) includes a pole with the small customized shape LED structure or a display device with either solar panel or grid supply. These systems are made of a control circuitry, battery, Charger from solar panel or Grid and wires circuit that communicates with all external wireless components like sensor based infrastructure article (101) that is placed on the road. The warning system (108) can also help to warn the drivers for incoming vehicle alert.

The solar panel helps to convert the solar energy from the sun and stores the charge in the battery. The stored charge can be utilized in the night times to light up the light and drive all electronics in the system.

The Infrastructure articles (101) are powered by the battery which in turn gets the energy from the solar panel placed on top of it for charging. The infrastructure article (101) will detect any movement on the road from any direction across the infrastructure article (101). In an embodiment, the infrastructure articles (101) may have object detection sensors or vehicle detection sensors, for example, infrared sensors, wireless magnetometer, wireless ultrasonic sensors, radar sensors, optical sensors, and so on. These infrastructure articles (101) communicate the data (e.g. presence of vehicles or objects) to the synchronization controller (107) and the synchronization controller (107) in turn intimate the data to the warning system (108) available after the curve or bend where the vehicle is not seen. The infrastructure article (101) may communicate this data to one or more infrastructure article (101) and then in turn communicate the data to the synchronization controller (107). The warning system (108) will display the incoming vehicle alert to the other side so that the incoming vehicle driver will know the vehicle ahead and hence reduces the speed and will be taking necessary action. Further the warning system (108) may also display the traffic in the road, road block, accidents, weather alert, speed of the incoming vehicle, presence of objects (e.g. moving objects, people, any animal) on the road, and so on. These warnings alert a road user to avoid untoward incidents such as, accidents, hitting a person, animal or moving object.

Figure 5:
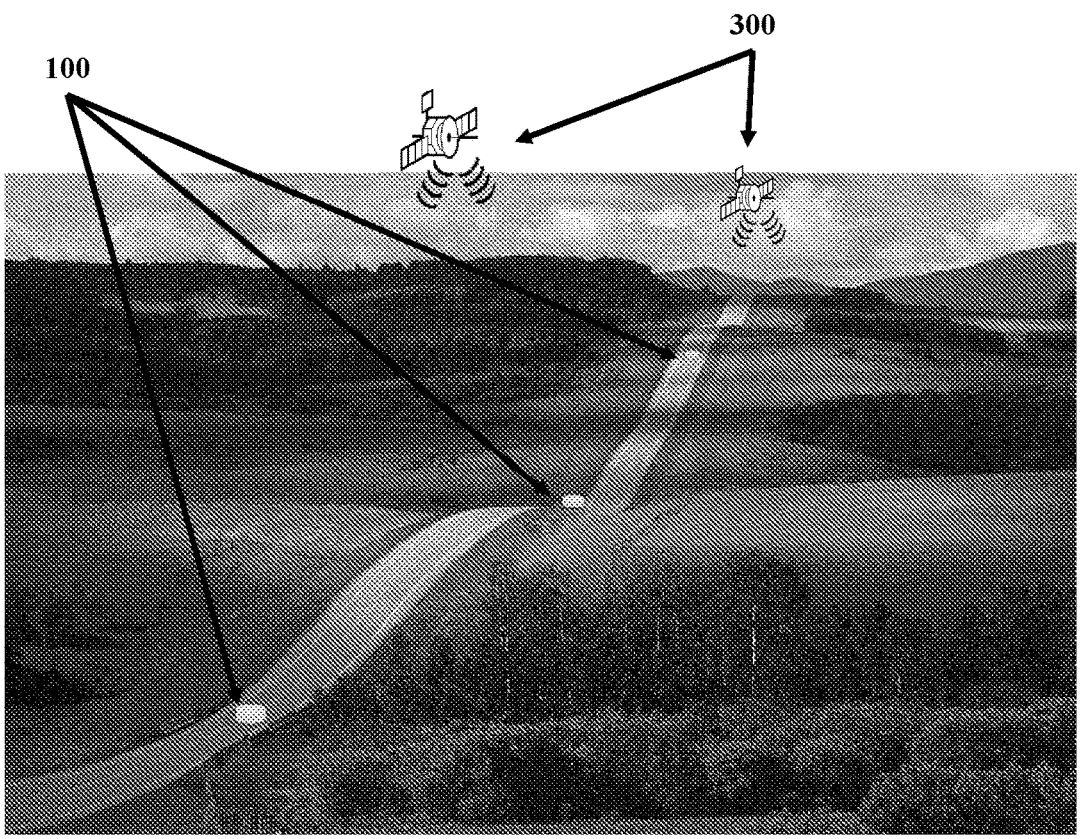
FIG. 5 illustrates an example scenario in which an infrastructure article receives timing information for synchronization from one or more satellite, according to an embodiment as disclosed herein.

FIG. 5 illustrates an example scenario in which an infrastructure article (101) receives timing information for synchronization from one or more satellites (300), according to an embodiment as disclosed herein. In an embodiment, this method of synchronization where a wireless chip (e.g. a GPS chip) present in the infrastructure article (101) gets the time information for synchronization from the one or more satellites (300). This method can be especially used in situations where the infrastructure articles (101) are widely spaced and/or without line of sight between the infrastructure articles (101) due which infrastructure article-to-infrastructure article synchronization communication and any communication become difficult. In a real scenario, if an infrastructure article (101) is not in sight with another infrastructure article then it will get the time information from the satellite (300) and if an infrastructure article (101) is in line of sight of another infrastructure article, then time synchronization occurs through RPM-to-RPM communication.

Figure 6:
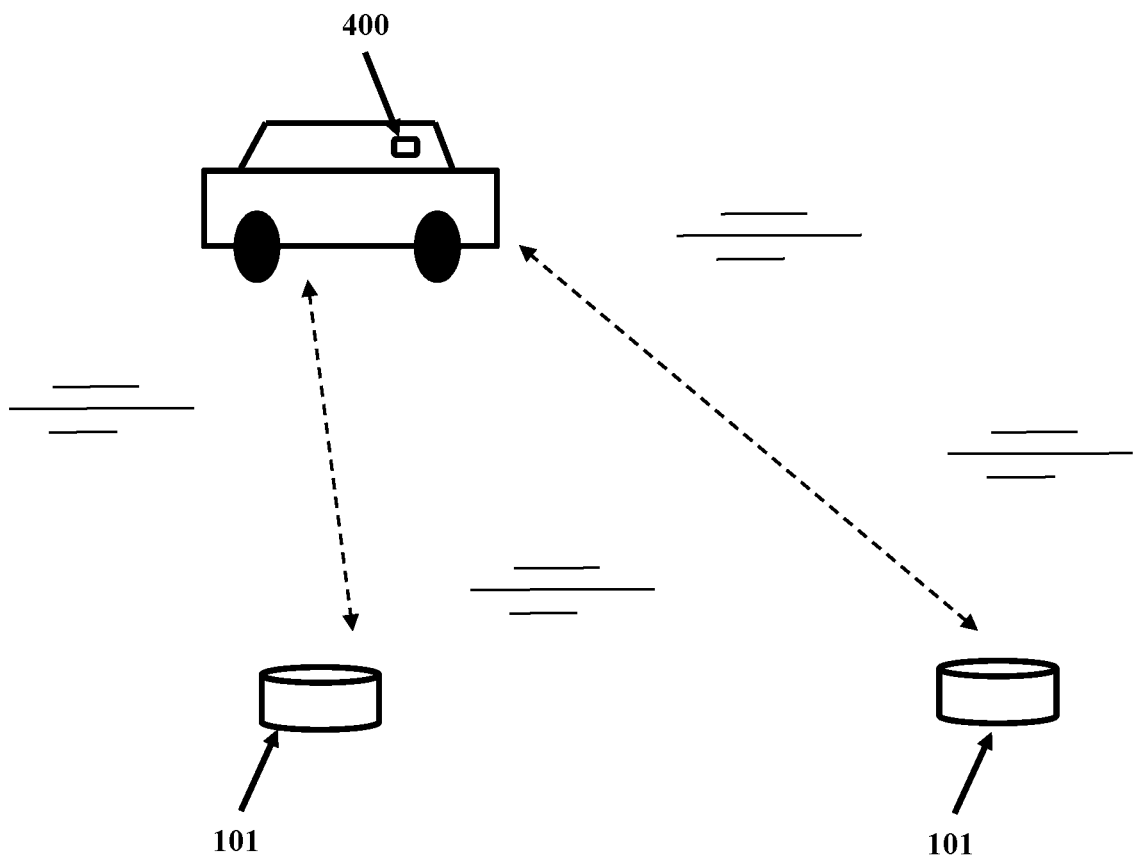
FIG. 6 illustrates an example scenario in which the infrastructure articles communicates with a vehicle radio communication system for the time information for synchronization, according to an embodiment as disclosed herein.

FIG. 6 illustrates an example scenario in which the infrastructure article (101) communicates with a vehicle radio communication system (400) for the time information for synchronization, according to an embodiment as disclosed herein. More vehicles, such as a vehicle (402) may have the vehicle radio system (400) that generates the time information. The vehicle radio communication system (400) in a vehicle helps in communicating with other vehicles or infrastructure articles or any infrastructure using for example, a dedicated short-range communication and other known communication technologies. The vehicle radio communication system (400) facilitates in gathering time information from a radio signal. The radio signal includes information of but not limited to, signal strength, direction, speed, and relative time. In this scenario, this a radio signal emitted by the vehicle radio communication system (400) is communicated to infrastructure articles (101) placed on the road. A radio communication system (404) in the infrastructure article (101) decodes the radio signal to gather time information and use this information for synchronization of blinks of the infrastructure articles (101). The synchronization of the articles (101) using this technique may enable all RPMs (101) to blink at the same time. The radio communication system (404) may be capable of being in a sleep mode or a normal mode. When the radio communication system (404) is in the sleep mode then the infrastructure article (101) may not receive any radio signal from the vehicles passing by in the vicinity of the infrastructure article (101).

In another embodiment, the infrastructure articles (101) may blink in a pattern for example, a progressive manner of direction of traffic or movement of vehicles having vehicle radio system, on the road.

It may be noted that in other embodiments, a radio communication system may be embodied in any device for example, a mobile device or an electronic device carried by a pedestrian, a bicyclist, a person travelling in vehicle, or fixed in a vehicle, a bicycle, electric powered vehicle, or positioned in vicinity of the infrastructure articles, and among others.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

Following are the reference numerals:

| Numeral | Description |
| --- | --- |
| 100 | Infrastructure article system |
| 101 | Infrastructure article |
| 102 | Real time clock |
| 103 | Wireless transceiver |
| 104 | Solar cells |
| 105 | Battery |
| 106 | Light source |
| 107 | synchronization controller |
| 108 | Warning System |
| 200 | Server |
| 300 | Satellite |
| 400 | vehicle radio communication system |
| 402 | Vehicle |
| 404 | radio communication system in infrastructure article |

We claim:

1. A method for synchronizing blinks of an Infrastructure article (101) in a mesh network, comprising:
   detecting, by the infrastructure article (101), an expiry of a sync timer counted by a real time clock (RTC) of the infrastructure article (101);
   determining, by the infrastructure article (101), whether a charge level of a battery (105) of the infrastructure article (101) meets a battery charge threshold; and
   performing, by the infrastructure article (101), both of:
      in response to determining that the charge level of the battery (105) of the infrastructure article (101) meets the battery charge threshold, establishing a connection with at least one of other infrastructure article and an infrastructure article server (200) in the mesh network, and sending a time to synchronize blink of at least one light source (106) to all other nodes in the mesh network; and
      in response to determining that the charge level of the battery (105) of the infrastructure article (101) does not meet the battery charge threshold, resetting the sync timer, and initiating a count of the sync timer by the RTC (102).

2. The method as claimed in claim 1, further comprising:
   determining, by the infrastructure article (101), a difference between current time data and previous time data;
   determining, by the infrastructure article (101), whether the difference meets a difference threshold; and
   performing, by the infrastructure article (101), one of:
      in response to determining that the difference meets the difference threshold, increasing a sync time of the sync timer, and resetting the sync timer to the increased sync time, and
      in response to determining that the difference does not meet the difference threshold, decreasing a sync time of the sync timer, and resetting the sync timer to the decreased sync time.

3. The method as claimed in claim 1, wherein the time to synchronize blink of the at least one light source (106) is sent by the infrastructure article (101) without communicating with the other infrastructure article (101) or the infrastructure article server (200) in the mesh network.

4. The method as claimed in claim 1, wherein the method comprises:
   detecting, by the infrastructure article (101), a night time counted by the RTC (102); and
   automatically configuring the infrastructure article (101) into a normal mode, wherein the normal mode switches on wireless communication along with all peripherals of the infrastructure article (101).

5. An infrastructure article (101) for synchronizing blinks in a mesh network, comprising:
   a real time clock (RTC) (101) to count a sync timer;
   a wireless transceiver (103);
   at least one solar cells (104);
   a battery (105) connected to the at least one solar cells (104) and the wireless transceiver;
   at least one light source (106) connected to the battery (105); and
   a synchronization controller (107), connected to the at least one light source (106), configured to:
   detect an expiry of the sync timer counted by the RTC (102);
   determine whether a charge level of the battery (105) of the infrastructure article (101) meets a battery charge threshold; and
   perform both of:
      in response to determining that the charge level of the battery of the infrastructure article (101) meets the battery charge threshold, establish a connection with at least one of other infrastructure article and infrastructure article server (200) in the mesh network, and send a time to synchronize blink of the at least one light source (106) to all other nodes in the mesh network; and
      in response to determining that the charge level of the battery (105) of the infrastructure article (101) does not meets the battery charge threshold, reset the sync timer and initiate a count of the sync timer by the RTC (102).

6. The infrastructure article (101) as claimed in claim 5, wherein the synchronization controller (107) is further configured to:
- determine a difference between current time data and previous time data;
- determine whether the difference meets a difference threshold; and
- perform one of:
  - in response to determining that the difference meets the difference threshold, increase a sync time of the sync timer, and reset the sync timer to the increased sync time, and
  - in response to determining that the difference does not meet the difference threshold, decrease a sync time of the sync timer, and reset the sync timer to the decreased sync time.

7. The infrastructure article (101) as claimed in claim 5, wherein the time to synchronize blink of the at least one light source (106) of the infrastructure article (101) is sent by the infrastructure article (101) without communicating with the other infrastructure article (101) or the infrastructure article server (200) in the mesh network.

8. The infrastructure article (101) as claimed in claim 5, wherein the synchronization controller (107) is further configured to:
- detect a night time counted by the RTC (102); and
- automatically configure the infrastructure article (101) into a normal mode, wherein the normal mode switches on wireless communication along with all peripherals of the infrastructure article (101).

9. The infrastructure article (101) as claimed in claim 5, wherein the synchronization controller (107) is further configured to:
- determine whether a signal is received from the at least one other infrastructure article in the mesh network; and
- detect a failure of the at least one other infrastructure article in response to determining that the signal is not received from the at least one infrastructure article in the mesh network.

\* \* \* \* \*